United States Patent
Johnston et al.

(10) Patent No.: US 10,031,427 B2
(45) Date of Patent: Jul. 24, 2018

(54) METHODS AND APPARATUS FOR VIBRATION DAMPING STAGE

(71) Applicant: Applied Materials, Inc., Santa Clara, CA (US)

(72) Inventors: Benjamin M. Johnston, Los Gatos, CA (US); Jeffrey Kaskey, Livermore, CA (US); Thomas Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/871,066

(22) Filed: Sep. 30, 2015

(65) Prior Publication Data

US 2017/0090303 A1    Mar. 30, 2017

(51) Int. Cl.
| | |
|---|---|
| G03F 7/20 | (2006.01) |
| F16F 7/10 | (2006.01) |
| F16F 15/00 | (2006.01) |
| F16F 15/02 | (2006.01) |

(52) U.S. Cl.
CPC ........ *G03F 7/70716* (2013.01); *F16F 7/1011* (2013.01); *F16F 15/002* (2013.01); *F16F 15/02* (2013.01)

(58) Field of Classification Search
None
See application file for complete search history.

(56) References Cited

U.S. PATENT DOCUMENTS

| | | | | |
|---|---|---|---|---|
| 5,895,924 | A * | 4/1999 | Yasuda | B82Y 10/00 250/398 |
| 6,341,007 | B1 * | 1/2002 | Nishi | G03F 7/70216 355/53 |
| 6,408,045 | B1 * | 6/2002 | Matsui | G03F 7/70716 355/53 |
| 6,590,633 | B1 * | 7/2003 | Nishi | G03F 7/70358 269/21 |
| 7,919,972 | B2 | 4/2011 | Kurita et al. | |
| 8,184,266 | B2 | 5/2012 | Starreveld et al. | |
| 8,670,106 | B2 | 3/2014 | Chen et al. | |
| 2001/0019229 | A1 * | 9/2001 | Sawai | G03F 7/70716 310/12.06 |

(Continued)

FOREIGN PATENT DOCUMENTS

| | | |
|---|---|---|
| CN | 101206409 A | 6/2008 |
| CN | 201134009 Y | 10/2008 |
| KR | 20150082342 A | 7/2015 |

OTHER PUBLICATIONS

Thomas W. Novak, A New VLSI Printer, 1978, SPIE vol. 135 Developments in Semiconductor Microlithography III, pp. 36-43.*

(Continued)

*Primary Examiner* — Steven H Whitesell Gordon
(74) *Attorney, Agent, or Firm* — Patterson + Sheridan LLP

(57) ABSTRACT

Systems and apparatus for performing photolithography processes are described. The system and apparatus may comprise a slab, at least one stage disposed on the slab, and a vibration damping system disposed on the slab, the vibration damping system comprising a weight that is substantially equal to a weight of one of the at least one stage and a substrate that moves simultaneously with movement of the one of the at least one stage.

20 Claims, 10 Drawing Sheets

(56) References Cited

U.S. PATENT DOCUMENTS

| | | | | |
|---|---|---|---|---|
| 2002/0186359 | A1* | 12/2002 | Meisburger | G03F 7/70041 355/69 |
| 2003/0218730 | A1* | 11/2003 | Murakami | G03F 7/7005 355/53 |
| 2004/0165172 | A1* | 8/2004 | Poon | G03F 7/70716 355/72 |
| 2007/0008513 | A1* | 1/2007 | Chung | G03F 7/7035 355/72 |
| 2007/0030472 | A1 | 2/2007 | Hoeks | |
| 2007/0103660 | A1* | 5/2007 | Tanaka | G03F 7/70716 355/53 |
| 2009/0208883 | A1* | 8/2009 | Nagasaka | G03F 7/70341 430/325 |
| 2013/0293865 | A1* | 11/2013 | Ummethala | H01J 37/20 355/75 |
| 2015/0144789 | A1 | 5/2015 | Peijster | |

OTHER PUBLICATIONS

International Search Report and Written Opinion for Application No. PCT/US2016/048030 dated Nov. 25, 2016.

\* cited by examiner

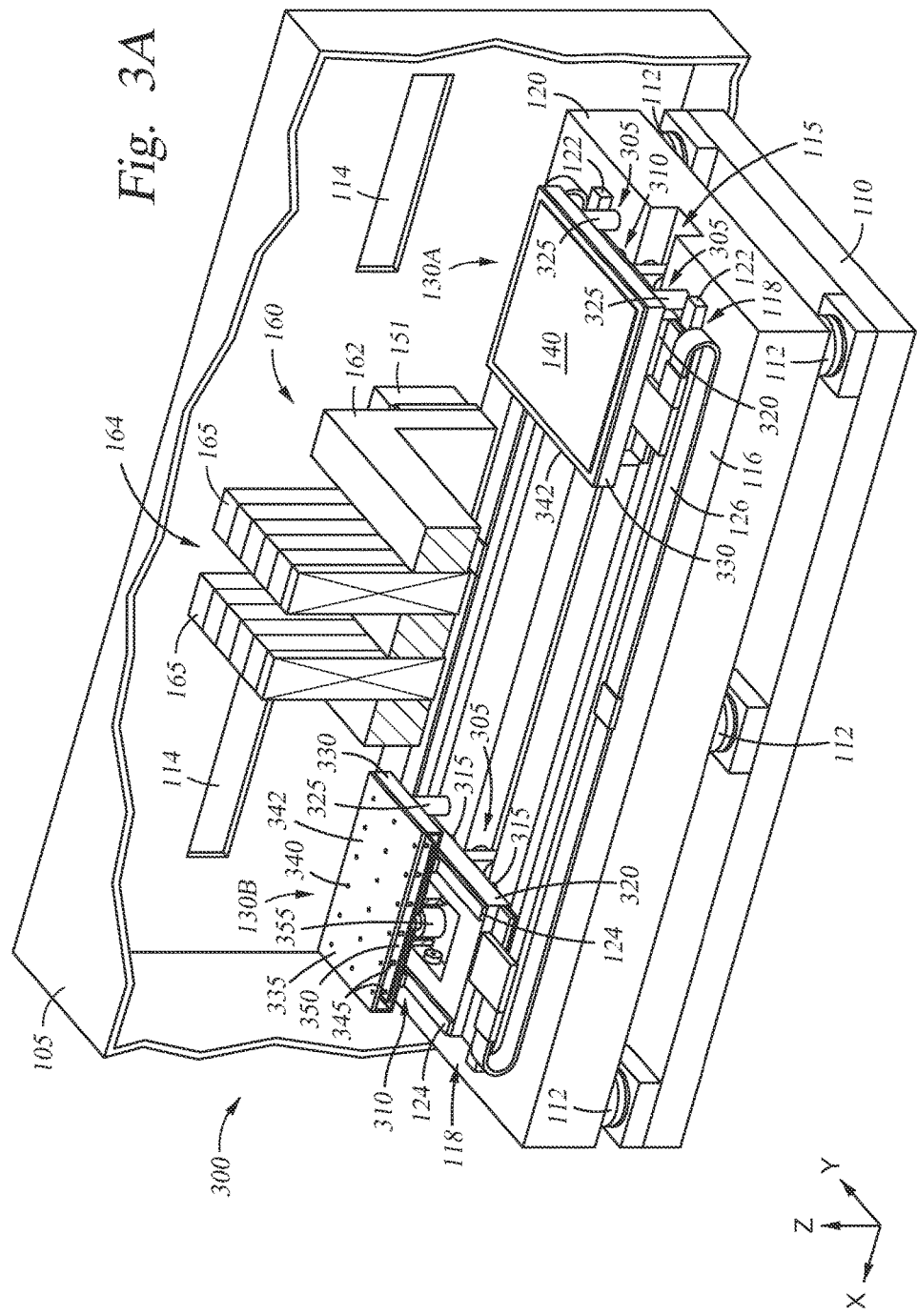

METHODS AND APPARATUS FOR VIBRATION DAMPING STAGE

BACKGROUND OF THE DISCLOSURE

Field

Embodiments of the present disclosure generally relate to systems and methods for performing digital photolithography processes on one or more substrates on a movable stage, and more specifically to systems and methods for minimizing vibration of the movable stage.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, instead of a mask, a pattern generator comprising multiple light sources exposes selected areas of the light-sensitive photoresist as part of a pattern with light to cause chemical changes to the photoresist in the selected areas. Exposure to light prepares these selected areas for subsequent material removal and/or material addition processes to create the electrical features on the surface of the substrate. During the exposure process, relative movement between the substrate and the light sources in a scanning motion may be used to produce the pattern. Resolution specifications for the display devices require precise movement in order to accurately form the pattern and vibration has a detrimental effect on accurate positioning of the light onto the photoresist.

In order to continue to provide display devices and other devices according to ever increasing resolution requirements, new apparatuses and methods are needed to precisely and cost-effectively create patterns on substrates, such as large area substrates.

SUMMARY OF THE DISCLOSURE

Embodiments of the present disclosure generally relate to systems and methods for performing digital photolithography processes on one or more substrates on a movable stage, and more specifically to systems and methods for minimizing vibration of the movable stage.

In one embodiment, a digital lithography system is provided and includes a slab, at least one stage disposed on the slab, and a vibration damping system disposed on the slab, the vibration damping system comprising a weight that is substantially equal to a weight of one of the at least one stages and a substrate that moves simultaneously with movement of the one of the at least one stages.

In another embodiment, a system for digital lithography is provided and includes a slab, two stages disposed on the slab, each of the two stages adapted to independently move along a first direction on a planar surface of the slab without contact with the slab, and a vibration damping system disposed on the slab, the vibration damping system comprising a weight that is substantially equal to a weight of one of the at least one stages and a substrate that moves simultaneously with movement of the one of the stages.

In another embodiment, a method for damping vibrations in or on a digital lithography system is provided and includes processing a first substrate by moving the substrate on a first stage in a first direction and first rate of movement relative to an image projection system disposed on a slab, and moving a weight that is substantially equal to a weight of the first stage and the substrate in a second direction and second rate of movement, the second rate of movement being substantially equal to the first rate of movement.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A is a perspective cut-away view of another embodiment of a digital lithography patterning system.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments herein generally provide methods, systems and apparatus for performing digital photolithography processes utilizing a dual stage lithography patterning system. In particular, embodiments herein provide methods, systems and apparatus for digital maskless photolithography to form a pattern on a large area substrate. In one embodiment, the large area substrate includes a surface area of about 1 square meter, or greater. The substrates are coated with a photoresist prior to introduction to the patterning system. As the substrate progresses through the patterning system on a stage or stages, the stage and/or the substrate may be subjected to some movement in the X and/or Y directions. Display resolution specifications require precise and/or controlled movement of the stage(s) in order to accurately form the pattern and vibration has a detrimental effect on accurate positioning of the light onto the photoresist. The apparatus and methods as described herein minimize vibration of the stage(s) which enhances pattern accuracy.

Figure 1:
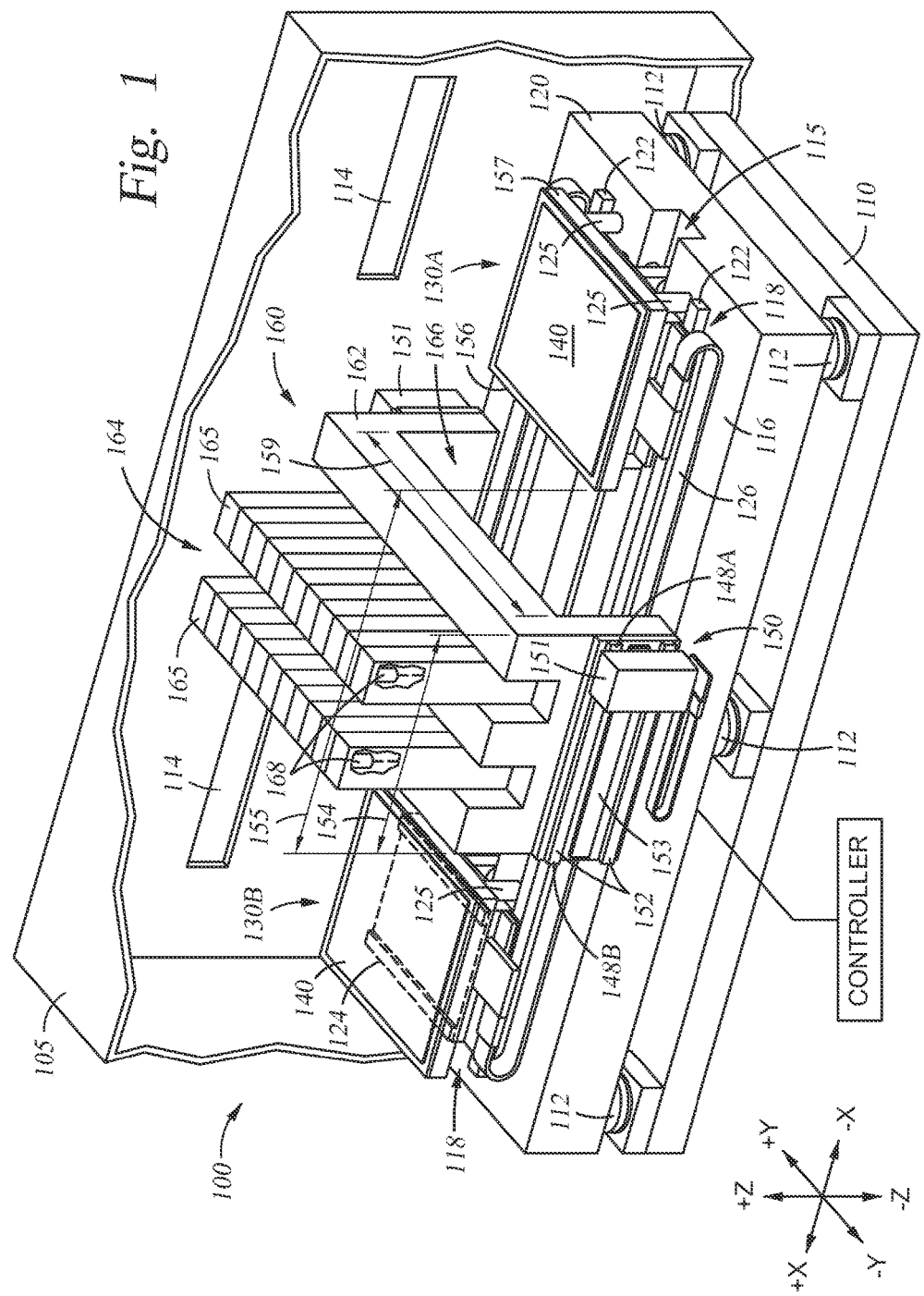
FIG. 1 is a perspective view one embodiment of a digital lithography patterning system that may benefit from embodiments disclosed herein.

FIG. 1 is a perspective view one embodiment of a digital lithography patterning system 100. The patterning system 100 includes an enclosure 105, a base frame 110, a slab 120, two stages 130A and 130B, and a processing apparatus 160. The enclosure 105 may be a temperature controlled safety enclosure adapted to operate at ambient pressures (at or near atmospheric pressures) with controlled air flow. The base frame 110 may rest on the floor of a fabrication facility and may support the slab 120. Passive air isolators 112 may be positioned between the base frame 110 and the slab 120. The slab 120 may be a monolithic piece of granite, and the two stages 130A and 130B may be movably disposed on the slab 120. A central channel 115 may be formed in a planar surface 116 of the slab 120 along a longitudinal axis (along the X direction) of the slab 120.

A substrate 140 may be supported by each of the stages 130A and 130B. A portion of the stage 130B is removed in order to view components below the substrate 140 positioned thereon. A plurality of holes (not shown in this view) may be formed in each stage 130A and 130B for allowing a plurality of lift pins (not shown in this view) to extend through an upper surface of the stage(s) 130A and 130B. The lift pins may rise to an extended position to receive the substrate 140, such as from a transfer robot (not shown) through a port 114. The transfer robot may position the substrate 140 on the lift pins, and the lift pins may thereafter gently lower the substrate 140 onto the stage(s) 130A and 130B.

The substrate 140 may, for example, be made of quartz and be used as part of a flat panel display. In other embodiments, the substrate 140 may be made of other materials suitable for electronic device formation. The substrate 140 may have a photoresist layer formed thereon for performing a photolithography process and formation of a pattern by the processing apparatus 160.

The patterning system 100 includes a drive system 118 for each of the stages 130A and 130B. The drive systems 118 include an X drive system comprising one or more linear drives 122 that move the stages 130A and 130B independently in the X direction. The drive systems 118 also include a Y drive system comprising one or more linear drives 124 that move the stages 130A and 130B independently in the Y direction. In one embodiment, each of the linear drives 122 and 124 may be linear motors having a magnet channel and a coil (both not shown) that facilitate movement of the stages 130A and 130B in a desired direction and velocity upon application of power. The drive systems 118 also include air bearings 125 that provide pressurized air to levitate the stages 130A and 130B independently during movement. Air and electrical power may be provided to the drive systems 118 by a cable tray 126 that may move in at least one direction with the stages 130A and 130B. In the embodiment shown, the cable tray 126 is disposed on each side of the stages 130A and 130B but may be positioned elsewhere. In some embodiments (not shown), the linear drives 122 may be positioned between the cable trays 126 and the stages 130A and 130B.

The processing apparatus 160 may include a support 162 and a processing unit 164. The support 162 may be a gantry structure having an opening 166. The opening 166 is sized to provide space for the stages 130A and 130B (and substrates 140 thereon) to pass under the processing unit 164. In one embodiment, the processing unit 164 is a pattern generator configured to expose a photoresist disposed on the substrates 140 in a maskless photolithography process. The processing unit 164 may include a plurality of image projection systems 168 disposed in a housing 165. The image projection systems 168 may include light sources, such as lasers, mirrors and other optical devices (not shown) utilized to perform maskless digital patterning. The image projection systems 168 may be part of a digital light projector device that utilizes laser light. In some embodiments, multiple laser light sources may be combined and projected onto a digital micro-mirror (e.g., a multi-faceted mirror) that redirects the light onto specific areas of the photoresist as one of the substrates 140 passes under the processing apparatus 160.

Both of the stages 130A and 130B and the substrates 140 are shown in FIG. 1 in a load/unload position. During operation, in this embodiment, one of the stages 130A or 130B moves in the X-direction from the load/unload position, as shown in FIG. 1, to a processing position wherein one of the stages 130A or 130B passes under the processing apparatus 160. The processing position may refer to one or more positions of the stage 130A or 130B as the stage 130A or 130B passes under the processing unit 164. The load/unload position may be any position of the stages 130A and 130B that is clear of the processing apparatus 160.

During operation, the stage 130A or 130B that includes the substrate 140 to be processed may be lifted (in the Z direction) by air bearings 125 disposed between the stage 130A or 130B and the planar surface 116 of the slab 120. The linear drives 122 may be actuated to move the stage 130A or 130B in the X direction into the opening 166 of the support 162. In some embodiments, the linear drives 124 may be used to move the stage 130A or 130B in the Y direction or laterally relative to the support 162 while the stage 130A or 130B is disposed within the opening 166. The air bearings 125 may be utilized to provide frictionless movement of the stage 130A or 130B in either of the X and Y directions. The movement of the stages 130A and 130B, actuation of the air bearings 125, as well as control of the processing unit 164 may be provided by a controller.

The controller may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

The patterning system 100 may also include one embodiment of a vibration damping system 150. The vibration damping system 150 according to this embodiment includes one or more weights, shown as counterweights 151, that are coupled to the slab 120. In this embodiment, the counterweights 151 are coupled to the support 162, which is fixed to the slab 120. The counterweights 151 are movably coupled to a track 152 that is aligned along the length of the slab 120 (in the X direction). The counterweights 151 are coupled to a linear drive 153 that is similar to the linear drives 122 and 124 described above. The track 152 includes a first end 148A and a second end 148B opposing the first end 148A. While not shown, the counterweight 151 on the far side of the slab 120 (adjacent to the portion of the enclosure 105) includes a track and linear drive similar to the counterweight 151 on the near side of the slab 120.

In operation, the counterweights 151 move in the X direction at the same time the stage 130A or 130B, having a to-be-processed substrate 140 thereon, is moved in the X direction within the opening 166 (e.g., during processing by the image projection systems 168). The collective weight of the two counterweights 151 may be greater than a weight of one of stages 130A or 130B in this embodiment. However, the collective weight of the counterweights 151 may be substantially equal to a weight of one of the stages 130A or 130B and a substrate 140 (e.g., the mass that moves in the X direction during processing). For example, when two counterweights 151 are used as shown, the combined weight of both counterweights 151 may equal the weight of one of the stages 130A or 130B and a substrate 140 mounted thereon. Substantially equal in this context may be defined as +/−0 kilograms (kg) to 2 kg. Moving the counterweights 151 simultaneously with the stage 130A or 130B during processing balances reaction forces at least in the X direction during processing of a substrate 140. Thus, vibration of the patterning system 100 is reduced due to the balanced reaction forces. The reduced vibration provides enhanced accuracy of a pattern that is formed on the substrate 140 by the image projection systems 168.

The velocity of the counterweights 151 may be substantially equal to the velocity of the stage 130A or 130B during the simultaneous movement. Similarly, the acceleration and deceleration of the counterweights 151 may be substantially equal to the acceleration and deceleration of the stage 130A or 130B. A speed of the stage 130A or 130B during processing may be about 100 millimeters per second (mm/sec) to about 10,000 mm/sec, such as about 5,000 mm/sec, or greater. Substantially equal may be defined as the same speed or within about a difference of 0 mm/sec to a difference of about +/− about 10 mm/sec, such as a difference of about 2 mm/sec, or less. In one embodiment, when one of the stages 130A or 130B moves in the +X direction during processing, the counterweights 151 move in an opposite direction (−X direction) during processing. A travel length 154 of the counterweights 151 may be less than a travel length 155 (e.g., a total travel length) of the stages 130A and 130B (an example of a travel length is shown with respect to the stage 130A in FIG. 1). The first end 148A and the second end 148B of the track 152 indicate respective ends of the travel length 154 of the counterweights 151. However, the travel length 154 of the counterweights 151 is substantially equal to an X direction travel length of the stages 130A or 130B when the substrate 140 is being processed by the image projection systems 168.

In another embodiment, two counterweights 151 may be utilized that have a collective weight of about one-half of the weight of one of the stages 130A or 130B and a substrate 140. However, in this embodiment, the two counterweights 151 are moved at two times the acceleration in the same amount of time. According to this embodiment, a length of the tracks 152 and the linear drive 153 may be greater than shown in FIG. 1 in order to lengthen the travel length 154 of the counterweights 151. According to this embodiment, the mass of the two counterweights 151 is lessened as compared to the embodiment described above which may reduce costs of the system. However, the two counterweights 151 are moved a twice the acceleration of the stages 130A or 130B during processing in same amount of time. Thus, two counterweights 151 having a reduced weight provide the same reaction force as if moving identically sized masses.

In one embodiment of processing a substrate 140, the stage 130A may move in the +X direction toward the opening 166 of the processing apparatus 160. The stage 130A may be moved at any speed prior to a leading edge 156 thereof reaching a plane 159 (in a Y-Z plane) indicating the initial beam path of one or more of the image projection systems 168 of the processing apparatus 160. During movement of the stage 130A toward the opening 166 (e.g., prior to the leading edge 156 reaching the plane 159), the counterweights 151 (on both sides) may be moved from the position shown (adjacent the first end 148A of the tracks 152) to the second end 148B of the tracks 152. Alternatively, the counterweights 151 (on both sides) may be positioned adjacent to the second end 148B of the tracks 152 prior to any movement of the stage 130A toward the opening 166. In either case, when the leading edge 156 of the stage 130A crosses the plane 159, the stage 130A may be controllably accelerated in the +X direction. Simultaneously, the counterweights 151 may be controllably accelerated in the −X direction during movement of the stage 130A in the +X direction. The stage 130A may reach a constant velocity in the +X direction and the counterweights 151 may reach a similar velocity in the −X direction. Prior to a trailing edge 157 of the stage 130A crossing the plane 159, the stage 130A may be controllably decelerated in the +X direction. Simultaneously, the counterweights 151 may be decelerated in the −X direction. The stage 130A may then stop momentarily and the counterweights 151 may be positioned as shown in FIG. 1 adjacent to the first end 148A and stopped.

In some embodiments, the stage 130A may move laterally (in the +Y or −Y direction) when the trailing edge 157 of the stage 130A is positioned adjacent to the plane 159. The stage 130A may move laterally by about 1 mm to about 3 mm in order to reposition the substrate 140 relative to the image projection systems 168. Thereafter, the stage 130A may be controllably accelerated in the −X direction. Simultaneously, the counterweights 151 may be controllably accelerated in the +X direction. The stage 130A may reach a constant velocity in the −X direction and the counterweights 151 may reach a similar velocity in the +X direction. Prior to a trailing edge 157 of the stage 130A crossing the plane 159, the stage 130A may be controllably decelerated in the −X direction. Simultaneously, the counterweights 151 may be decelerated in the +X direction. The stage 130A may then stop momentarily and the counterweights 151 may be positioned adjacent to the second end 148B and stopped. The lateral repositioning of the stage 130A and the substrate 140, as well as movement in the X direction, may be repeated as needed in order to expose the entire surface of the substrate 140 to the image projection systems 168.

When processing is completed, the stage 130A may be moved to the position shown in FIG. 1 and replaced by a transfer process. Thereafter, the stage 130B may move toward the opening 166 and be processed in the X direction in a reverse manner with respect to the stage 130A (e.g., initially in the −X direction instead of the +X direction). The counterweights 151 will move in the X direction opposite to the directions of the stage 130B in a reverse manner with respect to the processing of the substrate 140 on the stage 130A (e.g., initially in the +X direction instead of the −X direction). Lateral repositioning and subsequent X directional movement may repeat as needed similar to the processing of the substrate 140 on the stage 130A, with the exception of the stage 130B moving in a reverse X direction.

The transfer process according to this embodiment may require the stage 130A or 130B to remain in one position (not move) to prevent any vibrations from occurring. The transfer process otherwise produces negligible vibrations and may proceed without affecting processing of the substrate 140 on the stage 130A or 130B.

During the movement of the stage 130A at least in the X direction, the counterweights 151 move in an opposing direction at substantially the same speed and/or velocity of the stage 130A or 130B. The countermovement reduces or eliminates vibrations, which provides enhanced accuracy of a pattern formed on the substrate 140 since the light from the image projection systems 168 is not disturbed. Since no processing occurs during the repositioning in the Y direction, the counterweights 151 are not needed and may remain static at the first end 148A or the second end 148B.

Figure 2A:
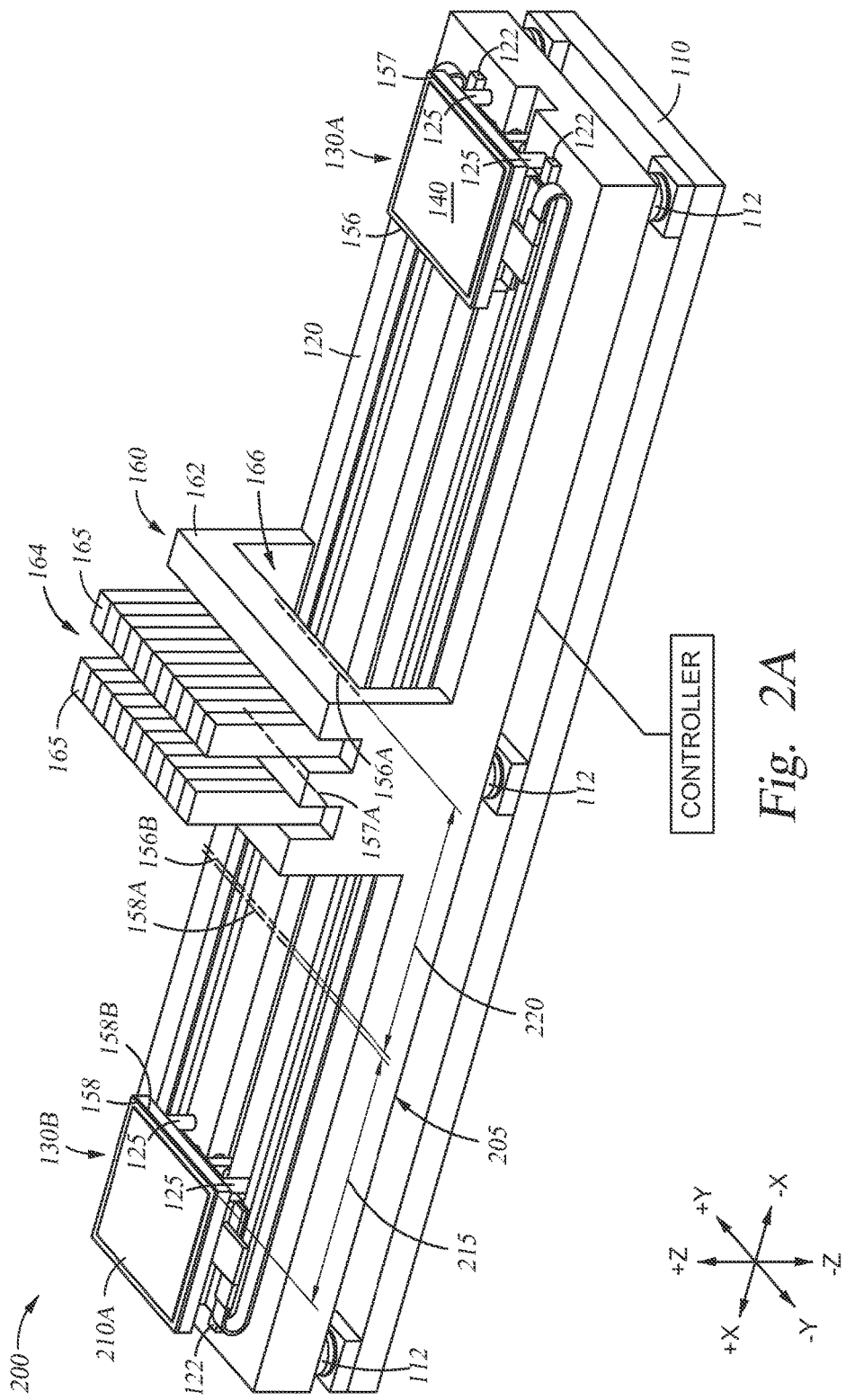
FIGS. 2A-2C are perspective views of another embodiment of a digital lithography patterning system.
Figure 2B:
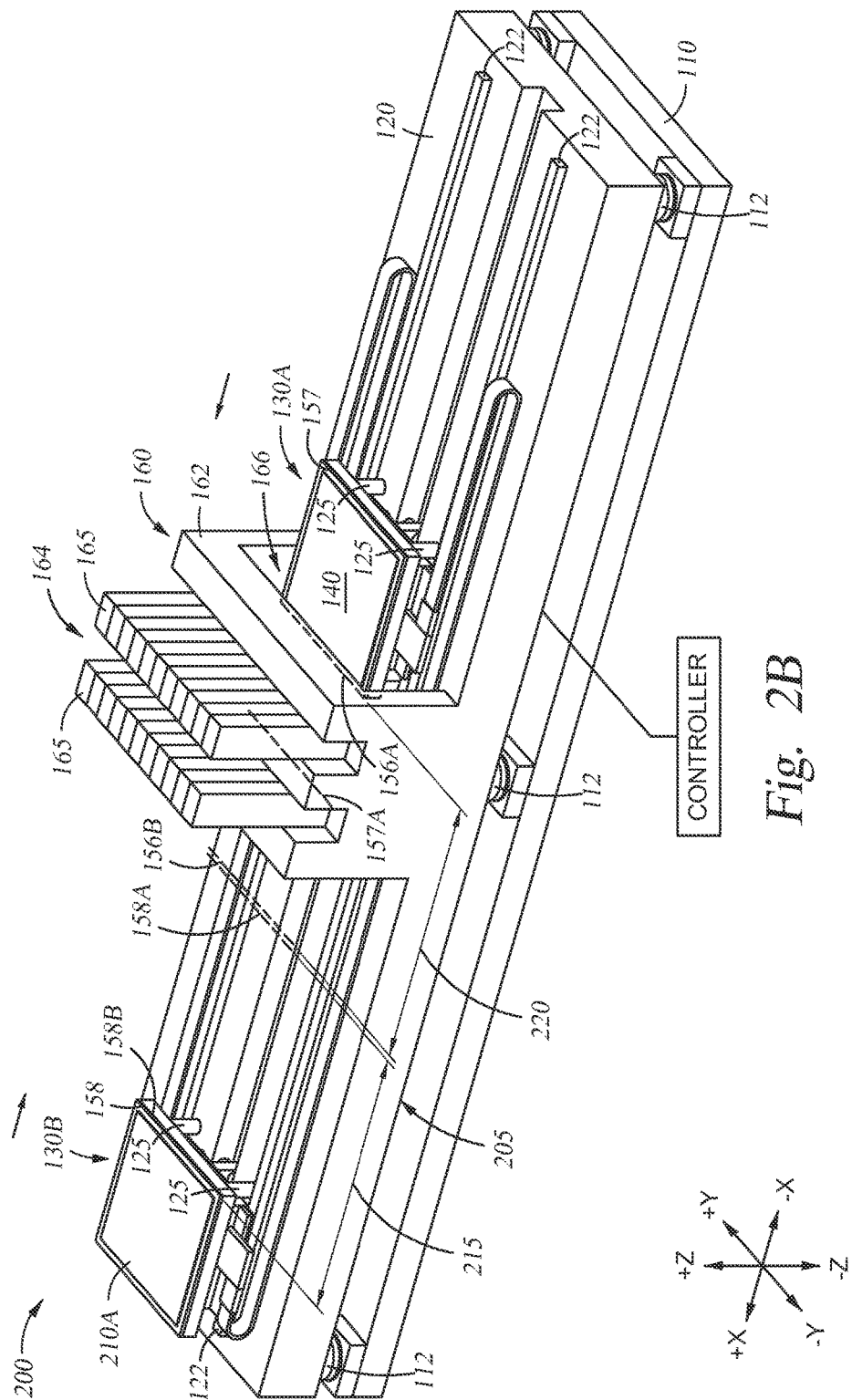
Figure 2C:
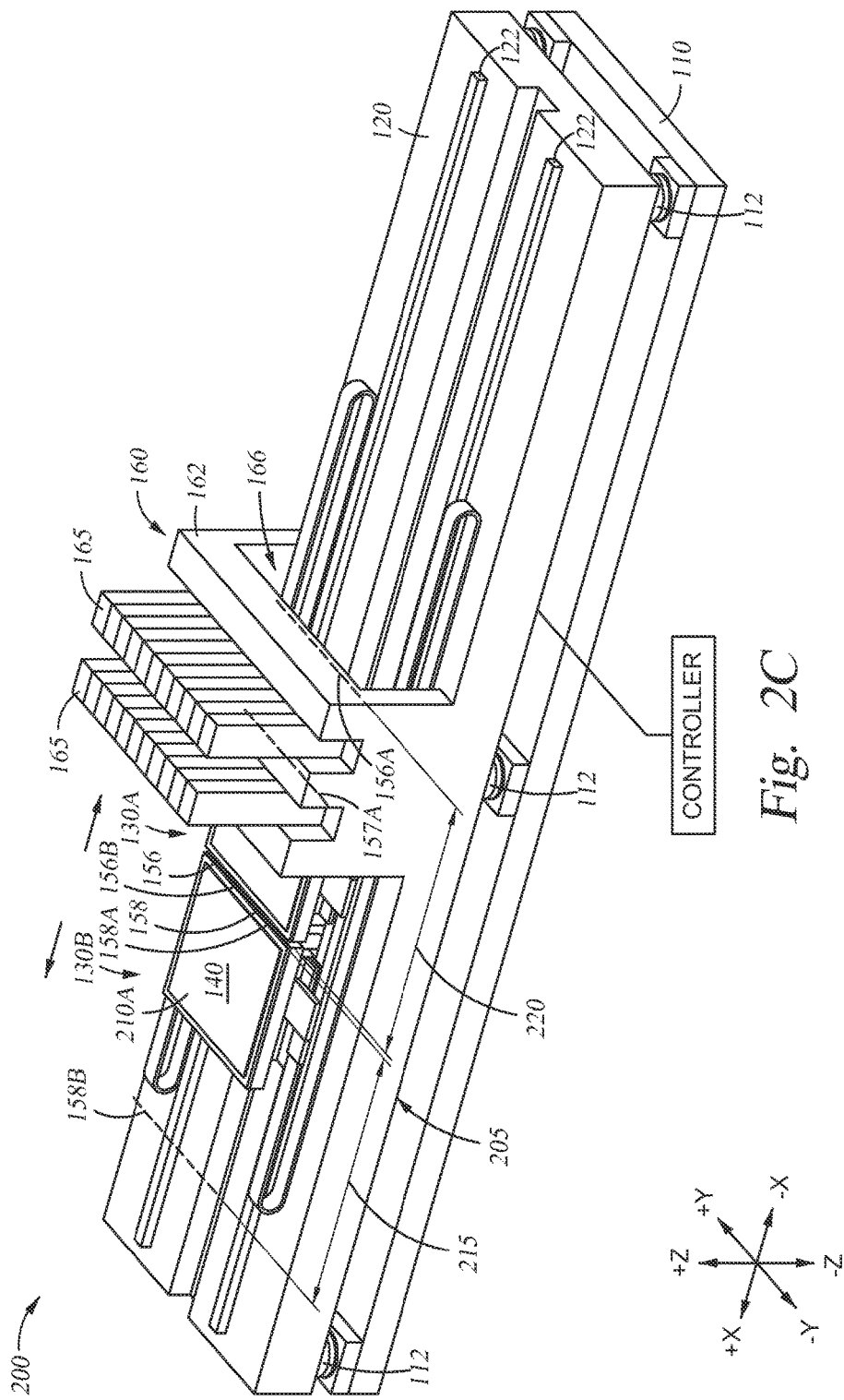

FIGS. 2A-2C are perspective views of another embodiment of a digital lithography patterning system 200. The patterning system 200 is similar to the patterning system 100 of FIG. 1 with the following exceptions. The patterning system 200 has a greater length (in the X direction, as compared to the patterning system 100 of FIG. 1) that comprises a portion of a vibration damping system 205.

The vibration damping system 205 also includes a controller adapted to move the stages 130A and 130B relative to each other during processing of a substrate 140 or 210A on the stages 130A and 130B respectively. In this embodiment, the substrate 140 on stage 130A is to be processed and the substrate 210A on stage 130B has been previously processed. The embodiment is explained as an example only and the substrate 140 may have been previously processed while the substrate 210A is to-be-processed. Additionally, an enclosure 105 (shown in FIG. 1) may be disposed about the patterning system 200.

The vibration damping system 205 also includes a travel length 215 of the stage 130B that is substantially equal to a travel length 220 of the stage 130A during processing. While not shown, travel lengths of the stages 130A and 130B may be reversed from this example when the substrate 210A is to-be-processed. The travel length 215 may comprise a length beginning at a Y-Z plane at an edge 158 of the stage 130B (along a Y-Z plane 158B) and ending at a plane 158A (a Y-Z plane). The travel length 220 comprises a length beginning at a plane 156A (similar to the plane 159 of FIG. 1) and ending at a plane 156B (a Y-Z plane).

In this embodiment, the stage 130B and the substrate 210A functions as a weight that may be utilized to balance reaction forces produced during movement of the stage 130A. In one embodiment of operation, with the substrate 140 not being processed, the stage 130A travels in the +X direction toward the processing apparatus 160. During this travel time, the substrate 210A may be transferred or remain on the stage 130B. When the leading edge 156 of the stage 130A approaches the plane 156A (similar to the plane 159 of FIG. 1), the stage 130A may be stopped. Thereafter, the leading edge 156 of the stage 130A may begin a controlled acceleration past the plane 156A and into the opening 166 for processing of the substrate 140 by the processing apparatus 160.

As shown in FIG. 2B, the stage 130B begins movement in the −X direction when the leading edge 156 (hidden in this view) of the stage 130A simultaneously with the movement of the stage 130A in the +X direction. The stage 130B may be accelerated in the −X direction at a rate that is substantially equal to the rate of acceleration of the stage 130A in the +X direction. The stage 130A may reach a constant velocity within the opening 166 during processing in the +X direction. Simultaneously, the stage 130B reaches a velocity in the −X direction that is substantially equal to the velocity of the stage 130A.

As shown in FIG. 2C, as the leading edge 156 of the stage 130A reaches an end of the travel length 220 (at the plane 156B), the stage 130B is near an end of the travel length 215 (at the plane 158A). At this time, both of the stages 130A and 130B may be controllably decelerated in opposite directions and stopped. The trailing edge 157 (not seen in this view) of the stage 130A may cross or stop at a plane 157A (a Y-Z plane) indicating the end of a beam path of one or more of the image projection systems 168 (shown in FIG. 1) of the processing apparatus 160. At this time, the stage 130A may move laterally (in the Y direction) to reposition the substrate 140 with respect to the processing apparatus 160. Thereafter, the stage 130A may begin moving in the −X direction through the opening 166. Simultaneously, the stage 130B may move at the same speed and/or velocity in the +X direction. The lateral repositioning of the stage 130A and the substrate 140, as well as movement in the X direction, may be repeated as needed in order to expose the entire surface of the substrate 140 to the image projection systems 168 (shown in FIG. 1). A similar process may be performed using the stage 130A as providing the countermovement to a substrate being processed using the stage 130B. As shown in FIG. 2C, an unprocessed substrate 210B may be transferred onto the stage 130B. The transfer of the substrates 210A and 210B may occur when the stage 130B is stationary or moving as the transfer process produces negligible vibrations and may proceed without affecting processing of the substrate that is being processed.

Moving the stages 130A and 130B simultaneously during processing balances reaction forces at least in the X direction during processing of a substrate 140. Thus, vibration of the patterning system 100 is reduced due to the balanced reaction forces. The reduced vibration provides enhanced accuracy of a pattern that is formed on the substrate 140 by the image projection systems 168 (shown in FIG. 1).

FIGS. 3A-3F are various views showing another embodiment of a digital lithography patterning system 300. The patterning system 300 shown in the remaining Figures is utilized to describe further details and subsystems. The patterning system 300 may be either the patterning system 100 of FIG. 1 or the patterning system 200 of FIG. 2.

FIG. 3A is a perspective cut-away view of the digital lithography patterning system 300. The patterning system 300 includes the drive systems 118. An X drive system 305 may include the linear drives 122 that move the stages 130A and 130B independently in the X direction. A Y drive system 310 may include the linear drives 124 that move the stages 130A and 130B independently in the Y direction. The X drive system 305 includes a plurality of air bearings 315 disposed between the planar surface 116 of the slab 120 and a first support body 320 of the stages 130A and 130B. The Y drive system 310 may include a plurality of air bearings 325 disposed between the planar surface 116 of the slab 120 and a second support body 330 of the stages 130A and 130B. According to this embodiment, the first support body 320 moves in the X direction relative to the planar surface 116 of the slab 120. Additionally, the second support body 330 moves in the X direction with the first support body 320, and also in the Y direction relative to the first support body 320 and/or the planar surface 116 of the slab 120.

As shown on the stage 130B, the second support body 330 may include a perforated plate 335 having a plurality of openings 340 formed in a substrate receiving surface 342. The substrate receiving surface 342 may include a surface area of about 1 square meter, or greater. Each of the openings 340 may be sized to receive a lift pin 345 that is part of a lift pin structure 350. The lift pin structure 350 may be disposed within the second support body 330 and/or on a side of the perforated plate 335 opposing the substrate receiving surface 342. An actuator 355 coupled to the lift pin structure 350 is utilized to move the lift pins 345 in the Z direction relative to the perforated plate 335. The lift pins 345 are spaced to a provide access for a robot or end effector (not shown) to fit therebetween. The lift pins 345 also include a length that provides a suitable spacing between the substrate receiving surface 342 and a lower surface of a substrate to allow access for the robot or end effector. Thus, a substrate 140 positioned on the substrate receiving surface 342 may be lifted or lowered thereon during a transfer process. The actuator 355 is coupled to and is movable with the stage 130B. While not shown, the stage 130A may be constructed similarly to the stage 130B.

Figure 3B:
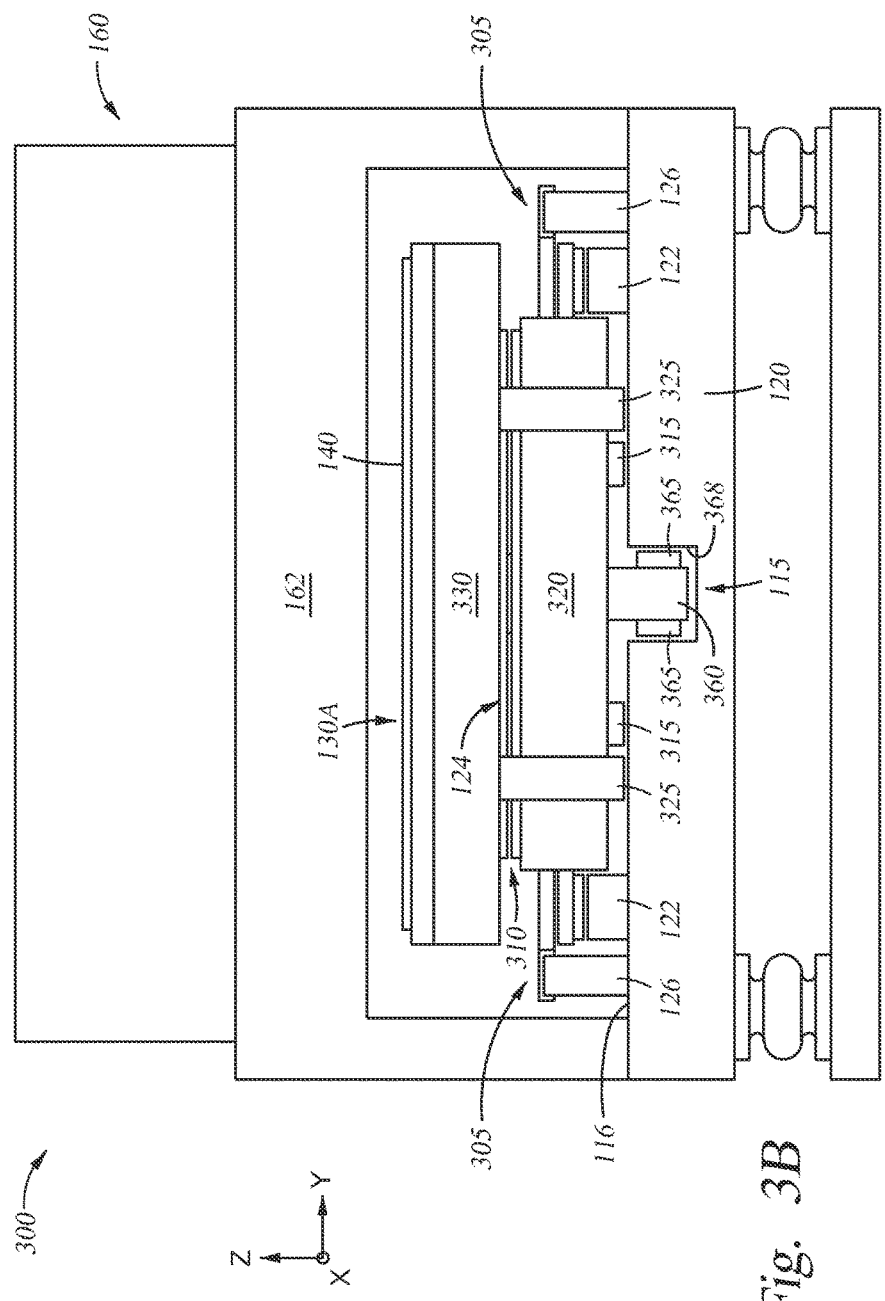
FIGS. 3B and 3C are end views of the patterning system of FIG. 3A.
Figure 3C:
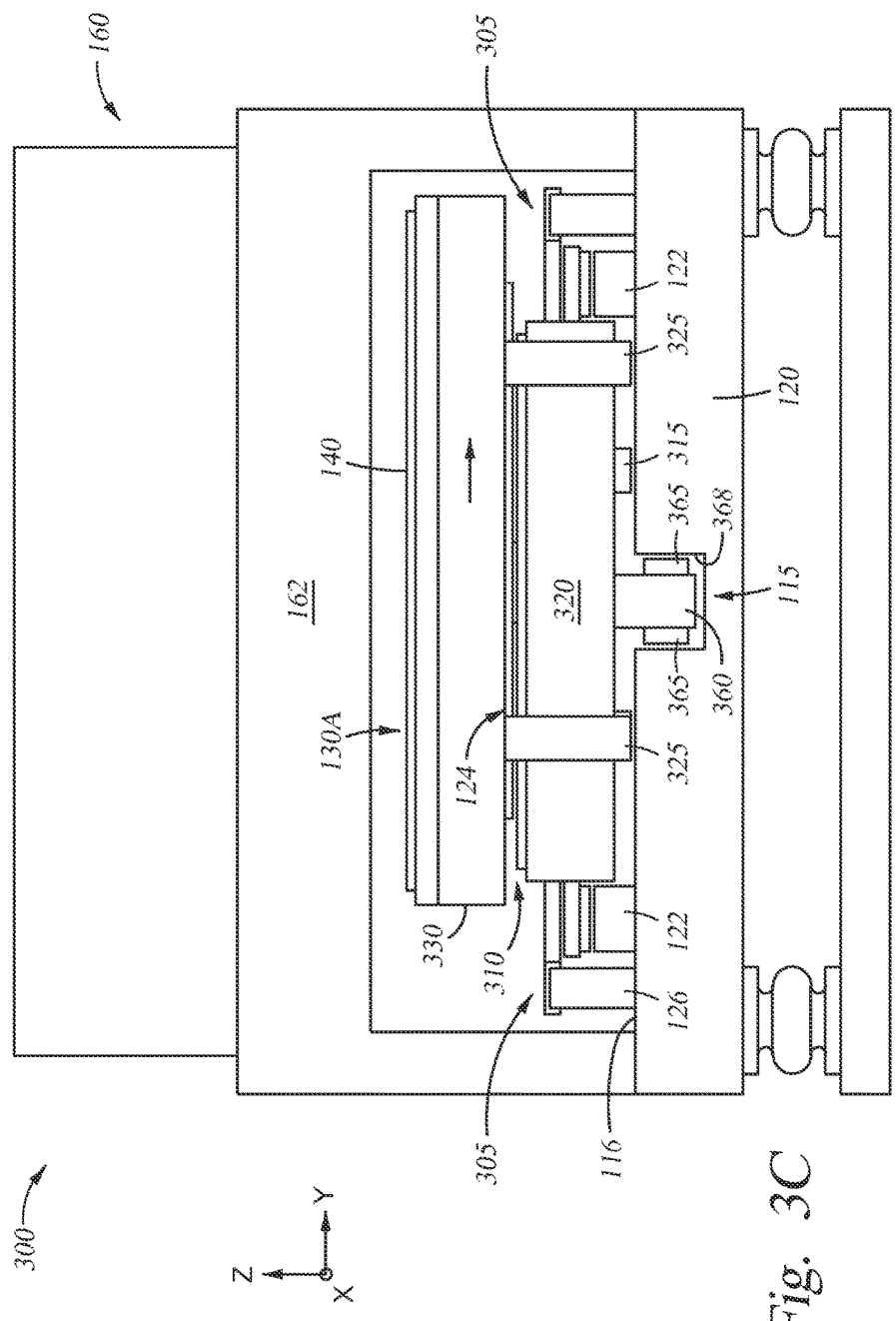

FIGS. 3B and 3C are front or rear end views of the patterning system 300. The X drive system 305 and the Y drive system 310 are clearly shown on the stage 130A. In FIG. 3B, the second support body 330 of the stage 130A is in a central position relative to the first support body 320. In FIG. 3C, the second support body 330 is shown in a lateral position (in the Y direction) relative to the first support body 320 as shown in FIG. 3B. Also shown in FIGS. 3B and 3C is the central channel 115. The central channel 115 may include a guide member 360 that is coupled to the stage 130A. The guide member 360 may include one or more air bearings 365 that may act against a surface 368 of the central channel 115. In one embodiment, the guide member 360 is utilized to prevent at least the first support body 320 from moving laterally (in the Y direction) when the stage 130A is moving in the X direction. While not shown, the stage 130B may include a guide member 360 similar to the stage 130A.

Figure 3D:
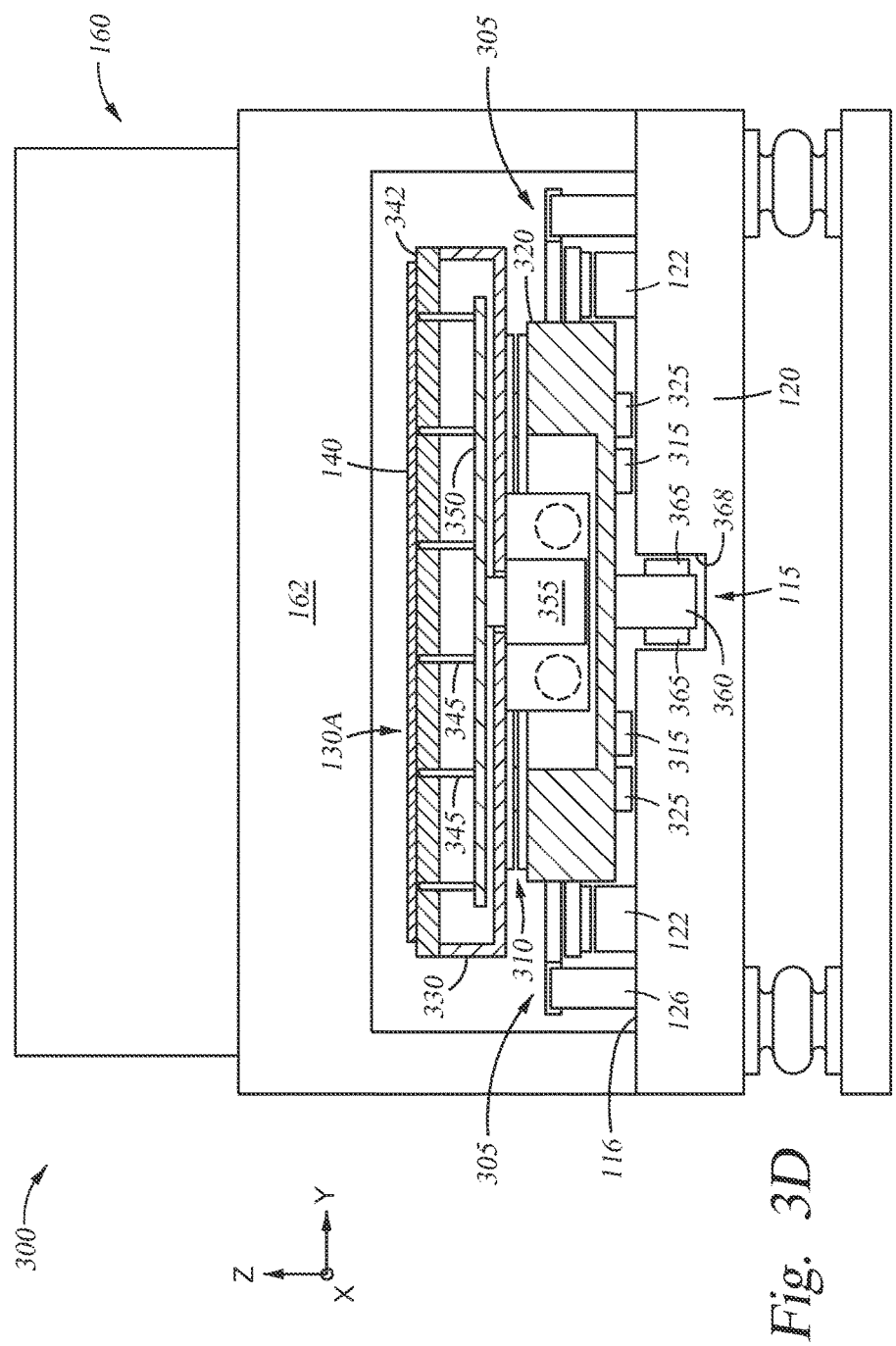
FIGS. 3D and 3E are cross-sectional views of the patterning system of FIG. 3B along the Y direction showing a cross-section of the stage.
Figure 3E:
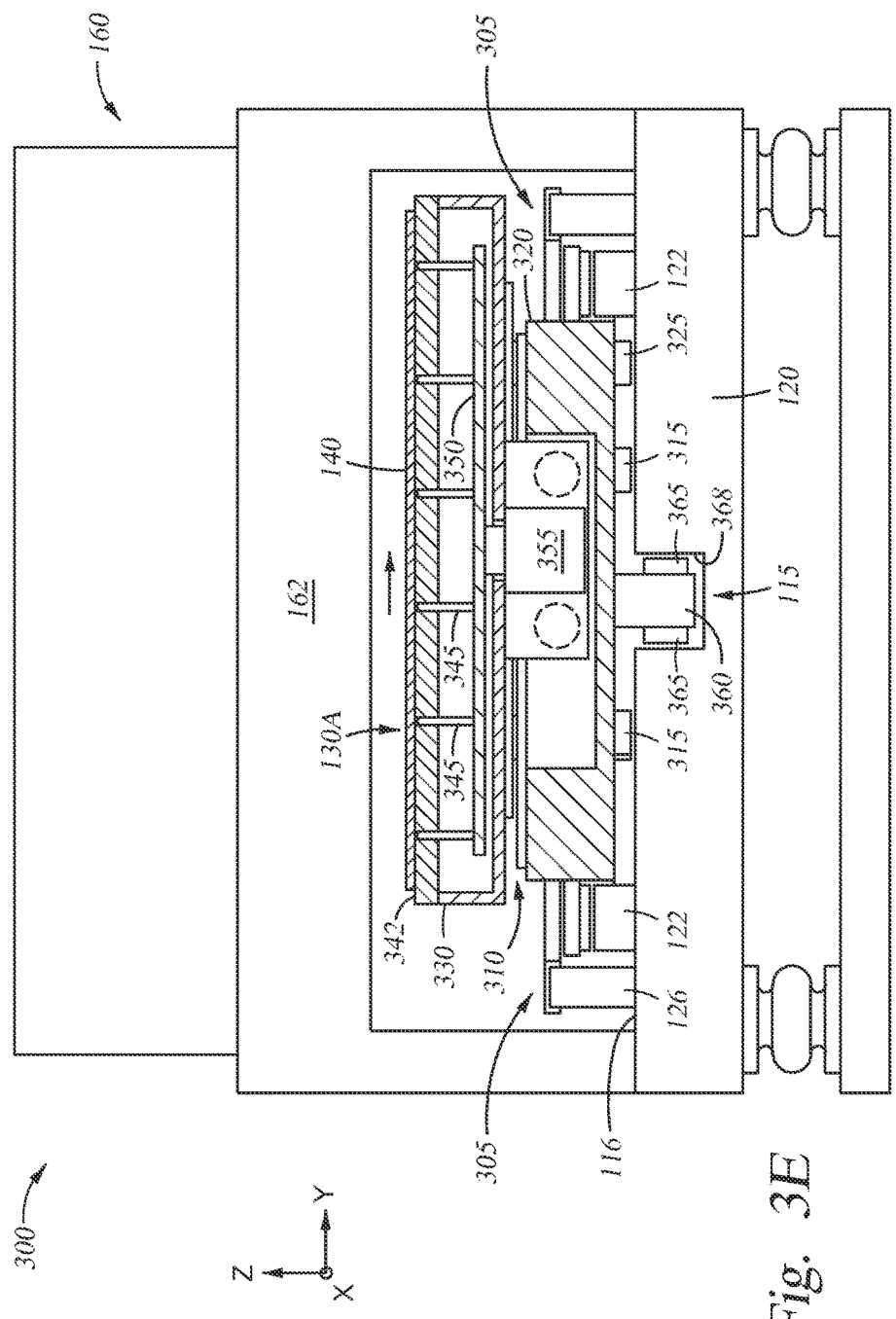

FIGS. 3D and 3E are cross-sectional views of the patterning system 300 of FIG. 3B along the Y direction showing a cross-section of the stage 130A. Details of the lift pin structure 350 and actuator 355 are shown in FIG. 3D in a processing position. The processing position depicted is a central position such that the second support body 330 is centered in the Y direction relative to the second support body 330 and/or the opening 166.

In FIG. 3E, the stage 130A is shown in a lateral re-positioning position. The Y drive system 310 is utilized to move the second support body 330 in the Y direction relative to the first support body 320. The lift pin structure 350 is also moved in the Y direction with the second support body 330.

Figure 3F:
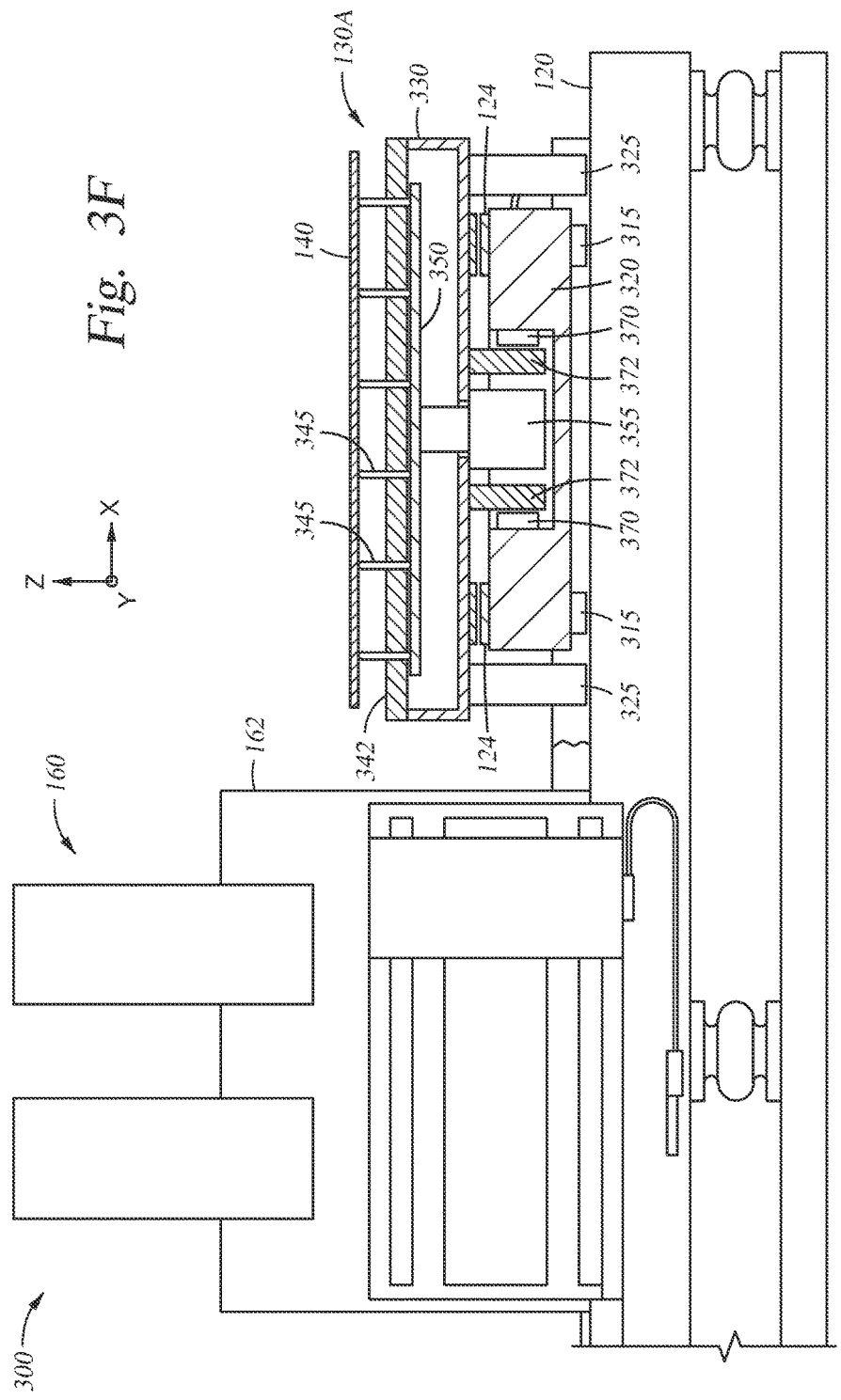
FIG. 3F is a side view of the patterning system of FIG. 3B along the X direction showing a cross-section of the stage.

FIG. 3F is a side view of the patterning system 300 of FIG. 3B along the X direction showing a cross-sectional view of the stage 130A. In FIG. 3F, the lift pin structure 350 is spaced apart from the substrate receiving surface 342 of the second support body 330. The actuator 355 is utilized to control the lift pin structure 350 vertically such that the lift pins 345 support the substrate 140 as shown for transfer, and lower the substrate 140 onto the substrate receiving surface 342 of the second support body 330, as shown in FIG. 3D and FIG. 3F. In some embodiments, the lift pin structure 350 may include plates 372 coupled thereto and air bearings 370 which act on the plates 372. The air bearings 370 and plates 372 may be utilized to control movement of the second support body 330 in the X direction when the second support body 330 is moving in the Y direction.

The vibration damping system 150 or the vibration damping system 205 as described herein reduces or eliminates vibration of a digital lithography patterning system, such as the patterning systems 100, 200 or 300 as described herein. The vibration damping system 150 or the vibration damping system 205 provides a balance to reaction forces produced by a moving stage (130A or 130B) and vibrations are reduced due to the balanced reaction forces. On the scale of processing used for direct digital photolithography, very slight movements result in major deviations in the patterns formed on substrates. The reduced vibration provided by the vibration damping system 150 or the vibration damping system 205 provides enhanced accuracy of the pattern that is formed on a substrate 140.

While the foregoing is directed to embodiments of the present disclosure, other and further embodiments of the disclosure may be devised without departing from the basic scope thereof, and the scope thereof is determined by the claims that follow.

The invention claimed is:

1. A system for digital lithography, comprising:
 a slab disposed in a temperature-controlled housing for operation at or near atmospheric pressures;
 a pair of stages disposed on the slab, at least one of the stages being movable in a first direction and a second direction orthogonal to the first direction; and
 a vibration damping system disposed on the slab, the vibration damping system comprising a pair of counterweights having a combined weight that is substantially equal to a weight of one stage of the pair of stages and a to-be-processed substrate that move in a common direction simultaneously based on movement of the one stage.

2. The system of claim 1, wherein the weight moves in a direction opposite a direction of movement of the one stage.

3. The system of claim 1, wherein the one stage of moves at a maximum speed of about 5,000 millimeters per second and has a substrate receiving surface with a surface area of about 1 square meter, or greater.

4. The system of claim 1, wherein the pair of counterweights are disposed on opposing sides of the slab.

5. The system of claim 4, wherein each of the counterweights are coupled to a magnetic drive.

6. The system of claim 5, wherein each magnetic drive is coupled to a controller that controls a rate of movement of the counterweights and the one stage.

7. The system of claim 6, wherein the rate of movement of each of the counterweights and the one stage is substantially the same, but in opposing directions.

8. The system of claim 1, wherein each of the two stages further include a plurality of lift pins movably disposed in openings formed in a surface thereof.

9. A system for digital lithography, comprising:
 a slab disposed in a housing adapted for operation at or near atmospheric pressures;
 two stages disposed on the slab, each of the two stages adapted to independently move along a first direction on a planar surface of the slab without contact with the slab, wherein each of the two stages include a plurality of lift pins movably disposed in openings formed in a surface thereof; and
 a vibration damping system disposed on the slab, the vibration damping system comprising a weight that is substantially equal to a weight of one of the two stages and a substrate that moves simultaneously with movement of the one of the two stages.

10. The system of claim 9, wherein the weight moves in a direction opposite a direction of movement of one of the two stages.

11. The system of claim 10, wherein the weight moves at a speed and rate that is substantially the same as a speed and rate of one of the two stages.

12. The system of claim 9, wherein the vibration damping system comprises one or more counterweights disposed on a side of the slab.

13. The system of claim 9, wherein the one of the two stages comprises a first stage and the weight comprises a second stage.

14. The system of claim 13, wherein a rate of movement of the second stage is substantially the same as a rate of movement of the first stage, but in opposing directions.

15. A method for damping vibrations on a digital lithography system, comprising:

patterning a first substrate in a maskless photolithography process by projecting light toward a digital micromirror that redirects light toward a surface of the substrate based on instructions from a controller as the substrate is at or near atmospheric pressures while moving the substrate on a first stage in a first direction and first rate of movement relative to the digital micromirror disposed on a slab; and moving a weight that is substantially equal to a weight of the first stage and the substrate in a second direction and second rate of movement, the second rate of movement being substantially equal to the first rate of movement.

16. The method of claim 15, wherein the second direction is opposite to the first direction and the first stage moves at a maximum speed of about 5,000 millimeters per second and has a substrate receiving surface with a surface area of about 1 square meter, or greater.

17. The method of claim 15, wherein the weight comprises a second stage and a second substrate, and the second direction is opposite to the first direction.

18. The method of claim 15, wherein the weight comprises two counterweights coupled to the slab.

19. The method of claim 18, wherein the second direction is opposite to the first direction.

20. The method of claim 15, further comprising lifting the substrate from a surface of the first stage after patterning.

* * * * *